United States Patent
Iyer et al.

(10) Patent No.: US 10,082,848 B2
(45) Date of Patent: Sep. 25, 2018

(54) SYSTEMS AND METHODS FOR THERMAL ADAPTATION FOR VIRTUAL THERMAL INPUTS IN A CHASSIS INFRASTRUCTURE

(71) Applicant: Dell Products L.P., Round Rock, TX (US)

(72) Inventors: Pushkala Iyer, Round Rock, TX (US); Dinesh Kunnathur Ragupathi, Round Rock, TX (US); Dominick A. Lovicott, Round Rock, TX (US); Yogesh Prabhakar Kulkarni, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 560 days.

(21) Appl. No.: 14/679,566

(22) Filed: Apr. 6, 2015

(65) Prior Publication Data
US 2016/0291654 A1    Oct. 6, 2016

(51) Int. Cl.
G06F 1/20 (2006.01)
G05B 15/02 (2006.01)

(52) U.S. Cl.
CPC ............. G06F 1/206 (2013.01); G05B 15/02 (2013.01)

(58) Field of Classification Search
CPC .......... G06F 1/206; G05B 15/02; G05D 23/19
USPC ....................................................... 700/282
See application file for complete search history.

(56) References Cited

U.S. PATENT DOCUMENTS

| | | | | |
|---|---|---|---|---|
| 6,207,937 B1 * | 3/2001 | Stoddard | ................. | C23C 16/52 219/483 |
| 2008/0028778 A1 * | 2/2008 | Millet | ..................... | G06F 1/206 62/129 |
| 2009/0012633 A1 * | 1/2009 | Liu | ......................... | G06F 1/206 700/90 |
| 2014/0032011 A1 * | 1/2014 | Artman | .............. | G05D 23/1932 700/300 |
| 2016/0274629 A1 * | 9/2016 | Lovicott | ................. | G06F 1/206 |

* cited by examiner

Primary Examiner — Kenneth M Lo
Assistant Examiner — Michael W Choi
(74) Attorney, Agent, or Firm — Jackson Walker L.L.P.

(57) ABSTRACT

A system management controller may include a thermal table, a host agent, and a thermal control system. The thermal table may comprise identifying parameters for supported remote temperature sensors external to an information handling system. The host agent may be configured to receive temperature sensor data of a remote temperature sensor. The thermal control system may be configured to provide thermal control of at least one of the information handling system and a chassis in which it is disposed by determining, based on an entry of the thermal table associated with the remote temperature sensor, a local input identifier of the system management controller that defines a virtual thermal input of the information handling system associated with the remote temperature sensor, and controlling thermal properties of at least one of the information handling system and the chassis based on the virtual thermal input and a temperature value associated therewith.

20 Claims, 4 Drawing Sheets

SYSTEMS AND METHODS FOR THERMAL ADAPTATION FOR VIRTUAL THERMAL INPUTS IN A CHASSIS INFRASTRUCTURE

TECHNICAL FIELD

The present disclosure relates in general to information handling systems, and more particularly to systems and methods for providing thermal adaptation in a chassis infrastructure.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Thermal control of an information handling system is traditionally dependent upon thermal inputs resident on the system board of the information handling system, including sensors, fans, and hardware information. However, there may be cases, such as in a chassis configured to receive a plurality of modular information handling systems, in which thermal control of an information handling system may be better managed with sensors remote to the information handling system. In addition, there are also cases in which thermal control of an information handling system is in charge of managing cooling of peripheral modular components. However, modifying chassis and information handling system components to use such remote sensors or control peripheral modular components often requires substantial manual modification and thermal tuning for a number of components of an information handling system, which may be time consuming and prone to error.

SUMMARY

In accordance with the teachings of the present disclosure, the disadvantages and problems associated with thermal control in information handling systems may be substantially reduced or eliminated.

In accordance with embodiments of the present disclosure, an information handling system may include a processor and a system management controller communicatively coupled to the processor. The system management controller may include a thermal table, a host agent, and a thermal control system. The thermal table may comprise identifying parameters for supported remote temperature sensors external to the information handling system. The host agent may be configured to receive temperature sensor data of a remote temperature sensor. The thermal control system may be configured to provide thermal control of at least one of the information handling system and a chassis in which the information handling system is disposed by determining, based on an entry of the thermal table associated with the remote temperature sensor, a local input identifier of the system management controller that defines a virtual thermal input of the information handling system associated with the remote temperature sensor, and controlling thermal properties of at least one of the information handling system and the chassis based on the virtual thermal input and a temperature value associated therewith.

In accordance with these and other embodiments of the present disclosure, a method may include receiving temperature sensor data of a remote temperature sensor external to a modular information handling system disposed in a chassis. The method may also include thermally controlling at least one of the information handling system and the chassis by determining, based on an entry of a thermal table associated with the remote temperature sensor, wherein the thermal table comprises identifying parameters for supported remote temperature sensors external to the information handling system, a local input identifier of a system management controller that defines a virtual thermal input of the information handling system associated with the remote temperature sensor, and controlling thermal properties of at least one of the information handling system and the chassis based on the virtual thermal input and a temperature value associated therewith.

In accordance with these and other embodiments of the present disclosure, a system management controller may include a thermal table, a host agent, and a thermal control system. The thermal table may comprise identifying parameters for supported remote temperature sensors external to the information handling system. The host agent may be configured to receive temperature sensor data of a remote temperature sensor. The thermal control system may be configured to provide thermal control of at least one of the information handling system and a chassis in which the information handling system is disposed by determining, based on an entry of the thermal table associated with the remote temperature sensor, a local input identifier of the system management controller that defines a virtual thermal input of the information handling system associated with the remote temperature sensor, and controlling thermal properties of at least one of the information handling system and the chassis based on the virtual thermal input and a temperature value associated therewith.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
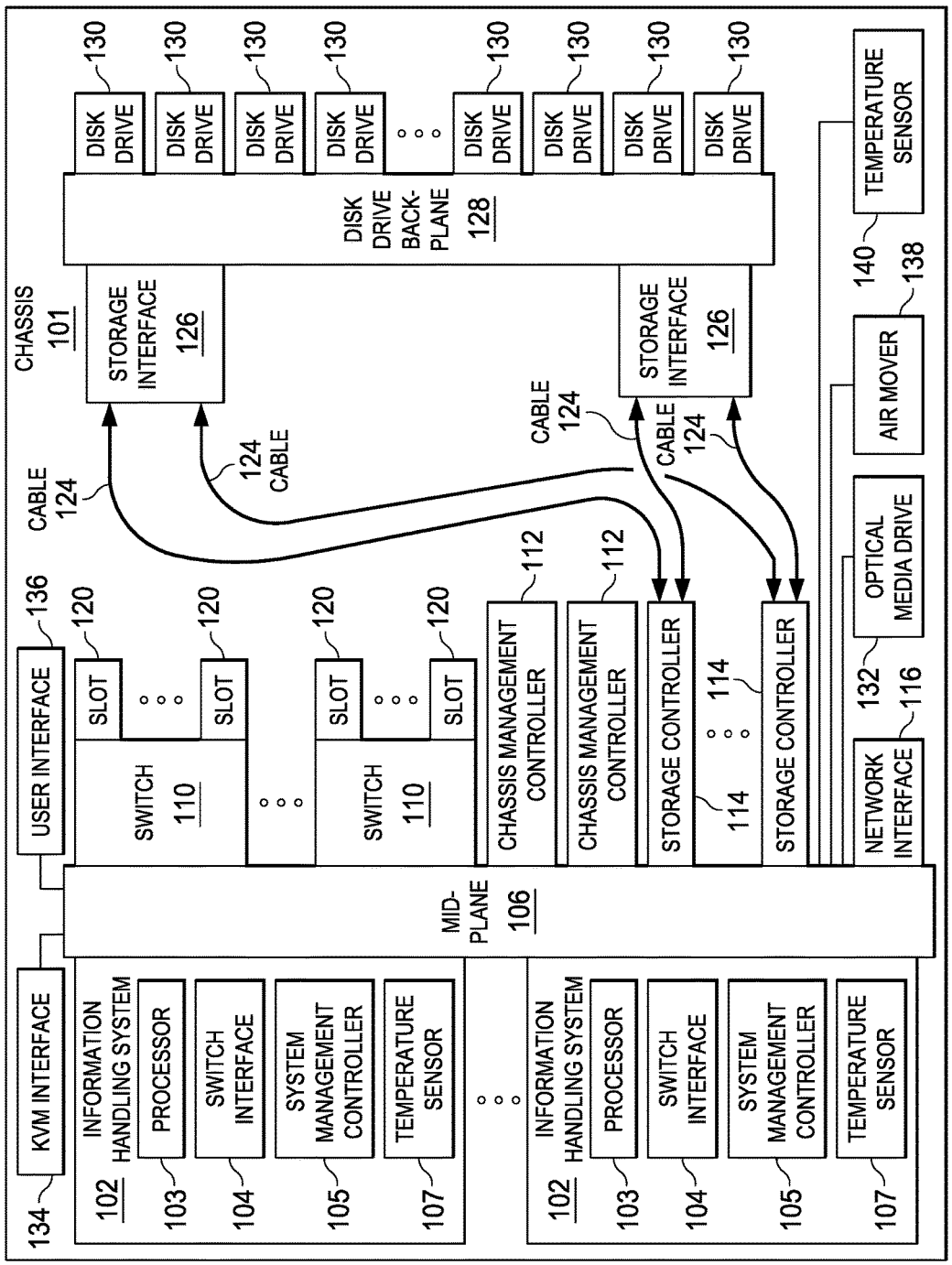
FIG. 1 illustrates a block diagram of an example system chassis with multiple information handling systems and with various peripheral and I/O capabilities common to the chassis as a whole, in accordance with embodiments of the present disclosure.

FIG. 1 illustrates a block diagram of an example system 100 having a chassis 101 with multiple information handling systems 102 and with various peripheral and I/O capabilities common to chassis 101 as a whole, in accordance with embodiments of the present disclosure. As depicted in FIG. 1, system 100 may comprise a chassis 101 including a plurality of information handling systems 102, a mid-plane 106, one or more switches 110, one or more chassis management controllers 112, a network interface 116, one or more slots 120, one or more cables 124, one or more storage interfaces 126, a disk drive backplane 128, a plurality of disk drives 130, an optical media drive 132, a keyboard-video-mouse ("KVM") interface 134, a user interface 136, one or more air movers 138, and one or more temperature sensors 140.

An information handling system 102 may generally be operable to receive data from and/or communicate data to one or more disk drives 130 and/or other information handling resources of chassis 101 via mid-plane 106 and/or switches 110. In certain embodiments, an information handling system 102 may be a server. In such embodiments, an information handling system 102 may comprise a blade server having modular physical design. In these and other embodiments, an information handling system 102 may comprise an M class server. As depicted in FIG. 1, an information handling system 102 may include a processor 103, one or more switch interfaces 104 communicatively coupled to processor 103, a system management controller 105 communicatively coupled to processor 103, and one or more temperature sensors 107.

A processor 103 may include any system, device, or apparatus configured to interpret and/or execute program instructions and/or process data, and may include, without limitation, a microprocessor, microcontroller, digital signal processor ("DSP"), application specific integrated circuit ("ASIC"), or any other digital or analog circuitry configured to interpret and/or execute program instructions and/or process data. In some embodiments, processor 103 may interpret and/or execute program instructions and/or process data stored in a memory, a disk drive 130, and/or another component of system 100.

A switch interface 104 may comprise any system, device, or apparatus configured to provide an interface between its associated information handling system 102 and switches 110. In some embodiments, switches 110 may comprise Peripheral Component Interconnect Express ("PCIe") switches, in which case a switch interface 104 may comprise a switch card configured to create a PCIe-compliant interface between its associated information handling system 102 and switches 110. In other embodiments, a switch interface 104 may comprise an interposer. Use of switch interfaces 104 in information handling systems 102 may allow for minimal changes to be made to traditional servers (e.g., M class servers) while supporting the overall system architecture disclosed herein. Although FIG. 1 depicts an implementation including a single switch interface 104 per information handling system 102, in some embodiments each information handling system 102 may include a plurality of switch interfaces 104 for redundancy, high availability, and/or other reasons.

A system management controller 105 may be implemented by, for example, a microprocessor, microcontroller, DSP, ASIC, EEPROM, or any combination thereof. A system management controller 105 may be configured to communicate with one or more of chassis management controllers 112 via midplane 106 (e.g., via an Ethernet management fabric). A system management controller 105 may be configured to provide out-of-band management facilities for management of information handling system 102. Such management may be made by elements of chassis 101 even if information handling system 102 is powered off or powered to a standby state. A system management controller 105 may include a processor, memory, and network connection separate from the rest of information handling system 102. In certain embodiments, a system management controller 105 may include or may be an integral part of a baseboard management controller (BMC), Dell Remote Access Controller (DRAC) or an Integrated Dell Remote Access Controller (iDRAC).

Temperature sensor 107 may be communicatively coupled to system management controllers 105 and may include any system, device, or apparatus (e.g., a thermometer, thermistor, etc.) configured to communicate a signal indicative of a temperature within information handling system 102.

Mid-plane 106 may comprise any system, device, or apparatus configured to interconnect modular information handling systems 102 with information handling resources. Accordingly, mid-plane 106 may include slots and/or connectors configured to receive information handling systems 102, switches 110, chassis management controllers 112, storage controllers 114, network interface 116, optical media drive 132, KVM interface 134, user interface 136, and/or other information handling resources. In one embodiment, mid-plane 106 may include a single board configured to interconnect modular information handling systems 102 with information handling resources. In another embodiment, mid-plane 106 may include multiple boards configured to interconnect modular information handling systems 102 with information handling resources. In yet another embodiment, mid-plane 106 may include cabling configured to interconnect modular information handling systems 102 with information handling resources.

A switch 110 may comprise any system, device, or apparatus configured to couple information handling systems 102 to storage controllers 114 (e.g., via mid-plane 106) and slots 120 and perform switching between information handling systems 102 and various information handling resources of system 100, including storage controllers 114 and slots 120. In certain embodiments, a switch 110 may comprise a PCIe switch. In other embodiments, a switch may comprise a generalized PC bus switch, an Infiniband switch, or other suitable switch. As shown in FIG. 1, chassis 101 may include a plurality of switches 110. In such embodiments, switches 110 may operate in a redundant mode for shared devices (e.g., storage controllers 114 and/or devices coupled to slots 120) and in non-redundant mode for non-shared/zoned devices. As used herein, shared devices may refer to those which may be visible to more than one information handling system 102, while non-shared devices may refer to those which are visible to only a single information handling system 102. In some embodiments, mid-plane 106 may include a single switch 110.

A chassis management controller 112 may be any system, device, or apparatus configured to facilitate management and/or control of system 100, its information handling systems 102, and/or one or more of its component information handling resources. A chassis management controller 112 may be configured to issue commands and/or other signals to manage and/or control information handling system 102 and/or information handling resources of system 100. A chassis management controller 112 may comprise a microprocessor, microcontroller, DSP, ASIC, field programmable gate array ("FPGA"), EEPROM, or any combination thereof. As shown in FIG. 1, a chassis management controller 112 may be coupled to mid-plane 106. Also as shown in FIG. 1, system 100 may include a plurality of chassis management controllers 112, and in such embodiments, chassis management controllers 112 may be configured as redundant. In some embodiments, a chassis management controller 112 may provide a user interface and high level controls for management of switches 110, including configuring assignments of individual information handling systems 102 to non-shared information handling resources of system 100. In these and other embodiments, a chassis management controller may define configurations of the storage subsystem (e.g., storage controllers 114, storage interfaces 126, disk drives 130, etc.) of system 100. For example, a chassis management controller may provide physical function configuration and status information that would normally occur at the driver level in traditional server implementations. Examples of physical functions include disk drive discovery and status, RAID configuration and logical volume mapping.

In addition or alternatively, a chassis management controller 112 may also provide a management console for user/administrator access to these functions. For example, a chassis management controller 112 may implement Web Services Management ("WS-MAN") or another suitable management protocol permitting a user to remotely access a chassis management controller 112 to configure system 100 and its various information handling resources. In such embodiments, a chassis management controller 112 may interface with a network interface separate from network interface 116, thus allowing for "out-of-band" control of system 100, such that communications to and from chassis management controller 112 are communicated via a management channel physically isolated from an "in band" communication channel with network interface 116. Thus, for example, if a failure occurs in system 100 that prevents an administrator from interfacing with system 100 via network interface 116 and/or user interface 136 (e.g., operating system failure, power failure, etc.), the administrator may still be able to monitor and/or manage system 100 (e.g., to diagnose problems that may have caused failure) via a chassis management controller 112. In the same or alternative embodiments, chassis management controller 112 may allow an administrator to remotely manage one or more parameters associated with operation of system 100 and its various information handling resources (e.g., power usage, processor allocation, memory allocation, security privileges, etc.). Although FIG. 1 depicts chassis 101 as having two chassis management controllers 112, chassis 101 may include any suitable number of chassis management controllers 112.

A storage controller 114 may include any system, apparatus, or device operable to manage the communication of data between one or more of information handling systems 102 and one or more of disk drives 130. In certain embodiments, a storage controller 114 may provide functionality including, without limitation, disk aggregation and redundancy (e.g., RAID), I/O routing, and error detection and recovery. As shown in FIG. 1, a storage controller 114 may be coupled to a connector on a switch 110. Also as shown in FIG. 1, system 100 may include a plurality of storage controllers 114, and in such embodiments, storage controllers 114 may be configured as redundant. In addition or in the alternative, storage controllers 114 may in some embodiments be shared among two or more information handling systems 102. As also shown in FIG. 1, each storage controller 114 may be coupled to one or more storage interfaces 126 via cables 124. For example, in some embodiments, each storage controller 114 may be coupled to a single associated storage interface 126 via a cable 124. In other embodiments, each storage controller 114 may be coupled to two or more storage interfaces 126 via a plurality of cables 124, thus permitting redundancy as shown in FIG. 1. Storage controllers 114 may also have features supporting shared storage and high availability. For example, in PCIe implementations, a unique PCIe identifier may be used to indicate shared storage capability and compatibility in system 100.

As depicted in FIG. 1, switch 110 may have coupled thereto one or more slots 120. A slot 120 may include any system, device, or apparatus configured to allow addition of one or more expansion cards to chassis 101 in order to electrically couple such expansion cards to a switch 110. Such slots 120 may comprise any suitable combination of full-height risers, full-height slots, and low-profile slots. A full-height riser may include any system, device, or apparatus configured to allow addition of one or more expansion cards (e.g., a full-height slot) having a physical profile or form factor with dimensions that practically prevent such expansion cards to be coupled in a particular manner (e.g., perpendicularly) to mid-plane 106 and/or switch 110 (e.g., the proximity of information handling resources in chassis 101 prevents physical placement of an expansion card in such a manner). Accordingly, a full-height riser may itself physically couple with a low profile to mid-plane 106, a switch 110, or another component, and full-height cards may then be coupled to full-height slots of a full-height riser. On the other hand, low-profile slots may be configured to couple low-profile expansion cards to switches 110 without the need for a full-height riser.

Slots 120 may also include electrically conductive elements (e.g., edge connectors, traces, etc.) allowing for expansion cards inserted into slots 120 to be electrically coupled to switches 110. In operation, switches 110 may manage switching of communications between individual information handling systems 102 and expansion cards coupled to slots 120. In some embodiments, slots 120 may be nonshared (e.g., each slot 120 is associated with a single information handling system 102). In other embodiments, one or more of slots 120 may be shared among two or more information handling systems 102. In these and other embodiments, one or more slots 120 may be configured to be compatible with PCIe, generalized PC bus switch, Infiniband, or another suitable communication specification, standard, or protocol.

Network interface 116 may include any suitable system, apparatus, or device operable to serve as an interface between chassis 101 and an external network (e.g., a local area network or other network). Network interface 116 may enable information handling systems 102 to communicate with the external network using any suitable transmission protocol (e.g., TCP/IP) and/or standard (e.g., IEEE 802.11, Wi-Fi). In certain embodiments, network interface 116 may include a network interface card ("NIC"). In the same or alternative embodiments, network interface 116 may be configured to communicate via wireless transmissions. In the same or alternative embodiments, network interface 116 may provide physical access to a networking medium and/or provide a low-level addressing system (e.g., through the use of Media Access Control addresses). In some embodiments, network interface 116 may be implemented as a local area network ("LAN") on motherboard ("LOM") interface.

In some embodiments, various components of chassis 101 may be coupled to a planar. For example, a planar may interconnect switches 110, chassis management controller 112, storage controllers 114, network interface 116, optical media drive 132, KVM interface 134, user interface 136, and/or other modular information handling resources of chassis 101 to mid-plane 106 of system 100. Accordingly, such planar may include slots and/or connectors configured to interconnect with such information handling resources.

Storage interfaces 126 may include any system, device, or apparatus configured to facilitate communication between storage controllers 114 and disk drives 130. For example, a storage interface may serve to permit a relatively small number of communication links (e.g., two) between storage controllers 114 and storage interfaces 126 to communicate with a greater number (e.g., 25) of disk drives 130. Thus, a storage interface 126 may provide a switching mechanism and/or disk drive addressing mechanism that allows an information handling system 102 to communicate with numerous disk drives 130 via a limited number of communication links and/or channels. Accordingly, a storage interface 126 may operate like an Ethernet hub or network switch that allows multiple systems to be coupled using a single switch port (or relatively few switch ports). A storage interface 126 may be implemented as an expander (e.g., a Serial Attached SCSI ("SAS") expander), an Ethernet switch, a FibreChannel switch, Internet Small Computer System Interface (iSCSI) switch, or any other suitable switch. In order to support high availability storage, system 100 may implement a plurality of redundant storage interfaces 126, as shown in FIG. 1.

Disk drive backplane 128 may comprise any system, device, or apparatus configured to interconnect modular storage interfaces 126 with modular disk drives 130. Accordingly, disk drive backplane 128 may include slots and/or connectors configured to receive storage interfaces 126 and/or disk drives 130. In some embodiments, system 100 may include two or more backplanes, in order to support differently-sized disk drive form factors. To support redundancy and high availability, a disk drive backplane 128 may be configured to receive a plurality (e.g., 2) of storage interfaces 126 which couple two storage controllers 114 to each disk drive 130.

Each disk drive 130 may include computer-readable media (e.g., magnetic storage media, optical storage media, opto-magnetic storage media, and/or other type of rotating storage media, flash memory, and/or other type of solid state storage media) and may be generally operable to store data and/or programs (e.g., one or more operating systems and/or one or more application programs). Although disk drives 130 are depicted as being internal to chassis 101 in FIG. 1, in some embodiments, one or more disk drives may be located external to chassis 101 (e.g., in one or more enclosures external to chassis 101).

Optical media drive 132 may be coupled to mid-plane 106 and may include any suitable system, apparatus, or device configured to read data from and/or write data to an optical storage medium (e.g., a compact disc, digital versatile disc, blue laser medium, and/or other optical medium). In certain embodiments, optical media drive 132 may use laser light or other electromagnetic energy to read and/or write data to an optical storage medium. In some embodiments, optical media drive 132 may be nonshared and may be user-configurable such that optical media drive 132 is associated with a single information handling system 102.

KVM interface 134 may be coupled to mid-plane 106 and may include any suitable system, apparatus, or device configured to couple to one or more of a keyboard, video display, and mouse and act as a switch between multiple information handling systems 102 and the keyboard, video display, and/or mouse, thus allowing a user to interface with a plurality of information handling systems 102 via a single keyboard, video display, and/or mouse.

User interface 136 may include any system, apparatus, or device via which a user may interact with system 100 and its various information handling resources by facilitating input from a user allowing the user to manipulate system 100 and output to a user allowing system 100 to indicate effects of the user's manipulation. For example, user interface 136 may include a display suitable for creating graphic images and/or alphanumeric characters recognizable to a user, and may include, for example, a liquid crystal display, cathode ray tube, a plasma screen, and/or a digital light processor projection monitor. In certain embodiments, such a display may be an integral part of chassis 101 and receive power from power supplies (not explicitly shown) of chassis 101, rather than being coupled to chassis 101 via a cable. In some embodiments, such display may comprise a touch screen device capable of receiving user input, wherein a touch sensor may be mechanically coupled or overlaid upon the display and may comprise any system, apparatus, or device suitable for detecting the presence and/or location of a tactile touch, including, for example, a resistive sensor, capacitive sensor, surface acoustic wave sensor, projected capacitance sensor, infrared sensor, strain gauge sensor, optical imaging sensor, dispersive signal technology sensor, and/or acoustic pulse recognition sensor. In these and other embodiments, user interface 136 may include other user interface elements (e.g., a keypad, buttons, and/or switches placed in proximity to a display) allowing a user to provide input to system 100. User interface 136 may be coupled to chassis management controllers 112 and/or other components of system 100, and thus may allow a user to configure various information handling resources of system 100 (e.g., assign individual information handling systems 102 to particular information handling resources).

Air mover 138 may be communicatively coupled to one or more chassis management controllers 112 via midplane 106, and may include any mechanical or electro-mechanical system, apparatus, or device operable to move air and/or other gases. In some embodiments, air mover 138 may comprise a fan (e.g., a rotating arrangement of vanes or blades which act on the air). In other embodiments, air mover 138 may comprise a blower (e.g., a centrifugal fan that employs rotating impellers to accelerate air received at its intake and change the direction of the airflow). In these and other embodiments, rotating and other moving components of air mover 138 may be driven by a motor. The rotational speed of the motor may be controlled by an air mover control signal communicated from a chassis management controller 112. In operation, air mover 138 may cool information handling resources of chassis 101 by drawing cool air into chassis 101, expelling warm air from inside chassis 101 to the outside of chassis 101, and/or move air across one or more heat sinks (not explicitly shown) internal to the chassis 101 to cool one or more components thereof.

Temperature sensor 140 may be communicatively coupled to one or more chassis management controllers 112 via midplane 106 and may include any system, device, or apparatus (e.g., a thermometer, thermistor, etc.) configured to communicate a signal indicative of a temperature within chassis 101.

Figure 2:
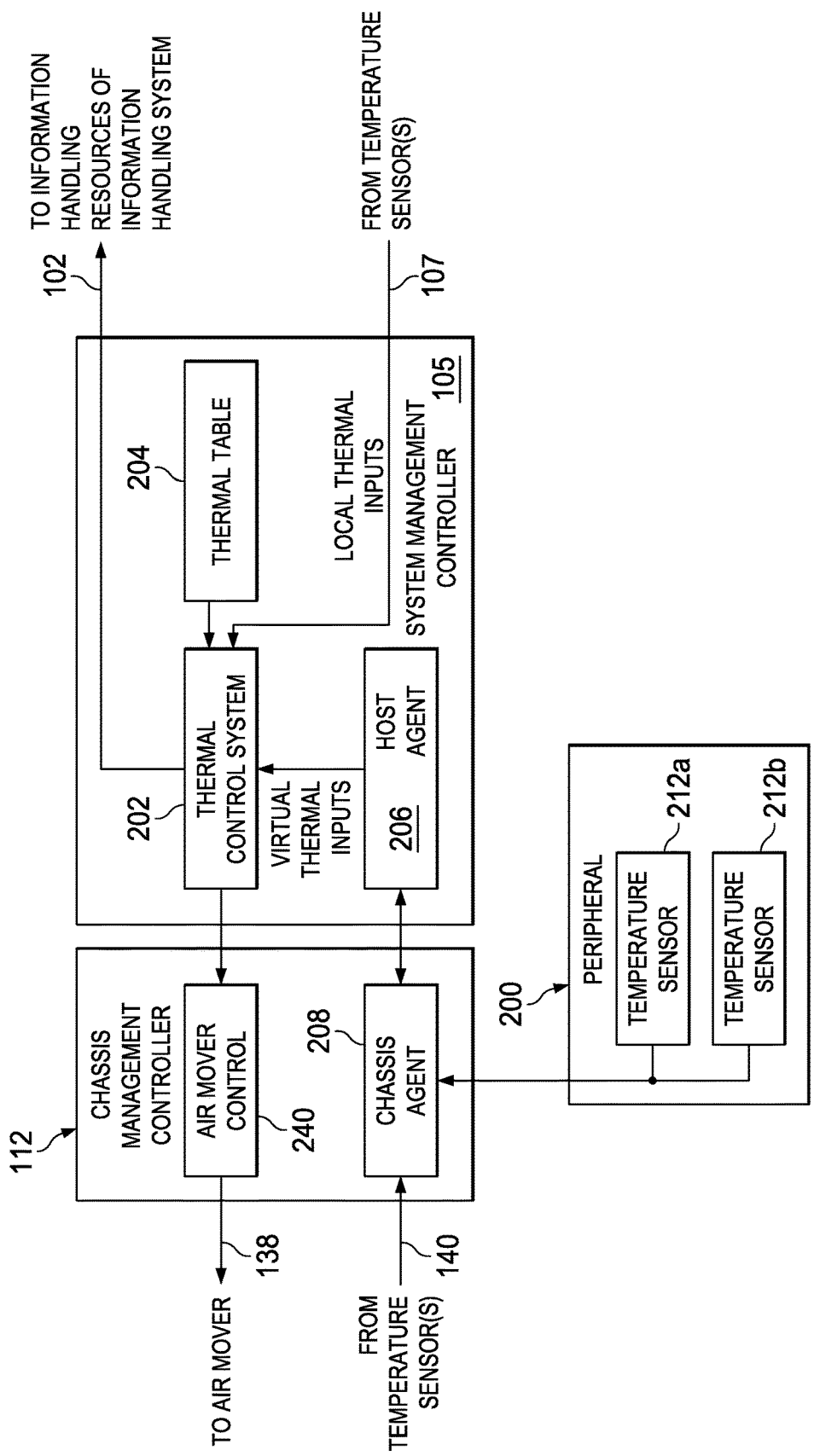
FIG. 2 illustrates a block diagram of selected components of a system chassis detailing methods and systems for thermal adaption of the system chassis using virtual thermal inputs, in accordance with embodiments of the present disclosure.

FIG. 2 illustrates a block diagram of selected components of system chassis 101 detailing methods and systems for thermal adaption of system chassis 101 using virtual thermal inputs, in accordance with embodiments of the present disclosure. As shown in FIG. 2, system management controller 105 may include an thermal control system 202, a thermal table 204, and a host agent 206. Thermal control system 202 may include any system, device, or apparatus configured to, based on thermal data (e.g., temperatures from sensors, thermal limits of system components, etc.), control the thermal performance of one or more components of chassis 101. For example, such control may include issuance of a control signal for controlling speed of air mover 138 (e.g., communication of a control signal to an air mover control 210 of chassis management controller 112 which in turn communicates a control signal to air mover 138). Additionally or alternatively, such control may include issuance of a control signal to information handling resources (e.g., processor 103) of the information handling system in which the system management controller 105 is located, in order to control operation of such information handling resources in respect to thermal data (e.g., cause information handling resources to operate at slower speeds in response to high temperatures and vice versa). In some embodiments, thermal control system 202 may be implemented as a program of executable instructions configured to be read and executed by system management controller 105 in order to carry out the functionality of thermal control system 202, including that functionality described herein.

Thermal table 204 may comprise a map, list, array, table, or other suitable data structure with one or more entries, each entry setting forth identifying parameters (e.g., device identifiers, thermal sensor names, sampling intervals, type of thermal control, sensor types, etc.) regarding temperature sensors that may be present in chassis 101. In particular, thermal table 204 may set forth identifying parameters for "known" or "supported" temperature sensors that may be used in information handling system 102 and may be constructed and stored within a read-only memory of system management controller 105 prior to runtime of information handling system 102 (e.g., during factory provisioning) that may in some embodiments only be updated in connection with periodic firmware updates to management controller 105.

Figure 3:
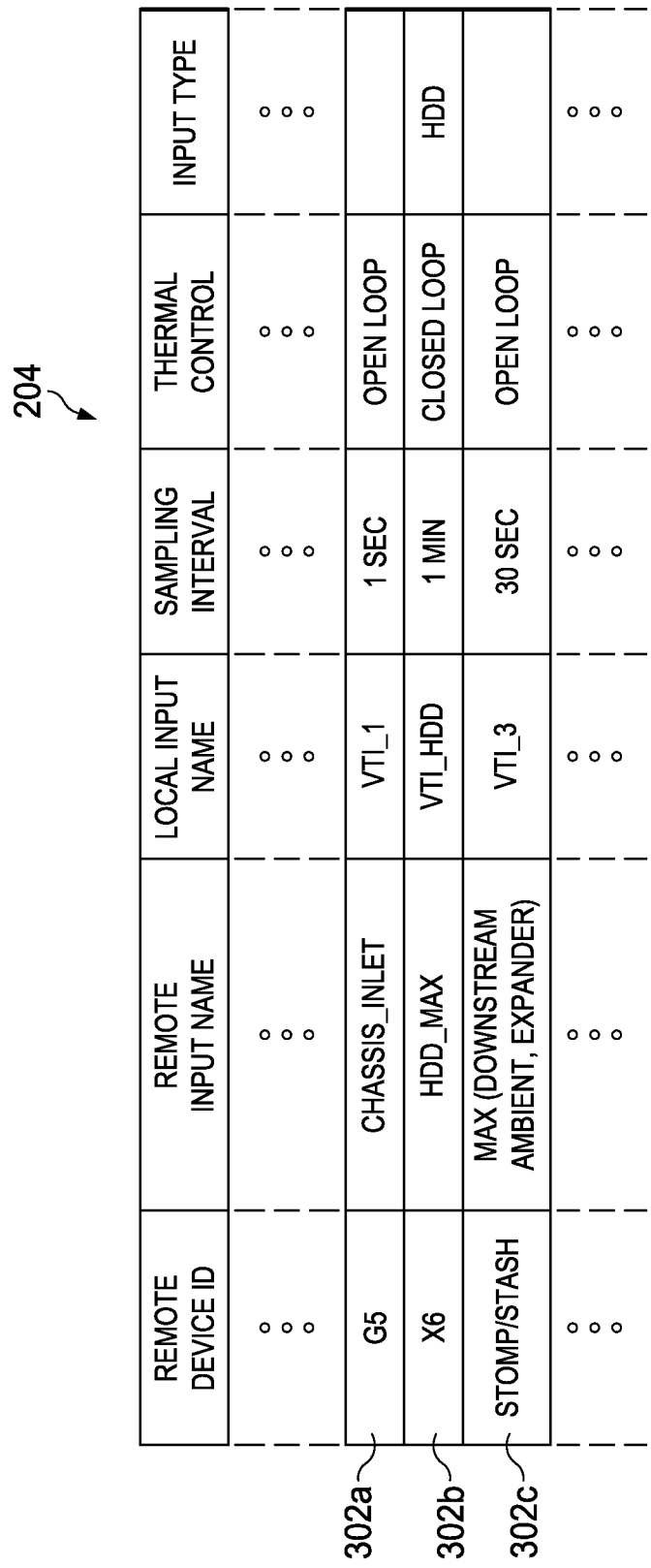
FIG. 3 illustrates a portion of an example thermal table of a system management controller, in accordance with embodiments of the present disclosure.

Turning briefly to FIG. 3, FIG. 3 illustrates a portion of an example thermal table 204 listing entries for temperature sensors remote from an information handling system 102 (e.g., temperature sensor 140, temperature sensors 212a and 212b of peripheral 200, etc.), in accordance with embodiments of the present disclosure. In this disclosure, "remote" from information handling system 102 shall mean a temperature sensor which is not integral to information handling system 102. Thus, temperature sensor 107 may be local to an information handling system 102, while temperature sensor 140 and temperature sensors 212a and 212b of peripheral 200 are remote from information handling system 102 even though such remote sensors may be included in the same chassis 101 as information handling system 102.

As shown in FIG. 3, for each of a plurality of known/supported remote temperature sensors, thermal table 204 may include an entry 302. Each entry 302 may set forth for each supported remote temperature sensor a remote device identifier, a remote input name, a local input name, a sampling interval, a type of thermal control, and an input type. The remote device identifier may identify a remote source information handling resource providing the sensor data. For example, entry 302 listing "G5" and its remote device identifier may indicate that the source device is a G5 chassis. As another example, entry 302 listing "X6" and its remote device identifier may indicate that the source device is an X6 hard drive.

The remote input name may identify the remote temperature sensor or other data source. For example, entry 302a listing "Chassis_Inlet" as its remote input name together with its remote device identifier indicates that the entry is for a chassis inlet temperature sensor on a G5 chassis. In some embodiments, the remote input name may not include a single value as in entries 302a and 302b, but may include a formula. For example, in entry 302c, the maximum of two values (e.g., an ambient temperature of a peripheral and a component temperature of the peripheral) may be calculated and assigned to a single local input name.

The local input name identifies a name local to the system management controller 105 for the remote sensor identified in the remote device identifier and remote input name fields, thus in effect creating a virtual local temperature input. Thus, for example, when a chassis inlet temperature sensor of a G5 chassis is present and available to a system management controller 105, it would be assigned the local input name of VTI_1 as indicated by entry 302a.

The sampling interval for an entry 302 defines the frequency at which the data of the remote sensor corresponding to the entry 302 is to be updated. Thus, in the embodiment represented by FIG. 3, sensor data from a chassis inlet temperature sensor of a G5 should be updated every second, as indicated by entry 302a.

The thermal control type indicates if the sensor data corresponding to the entry 302 should be applied to open loop thermal control or closed loop thermal control. For example, in an open loop thermal control algorithm, a particular speed of operation for air mover 138 may be set based on a sensed temperature with no feedback loop in the control algorithm. On the other hand, in a closed loop thermal control algorithm, a sensed temperature may be compared to a target temperature, and speed of operation for air mover 138 modified based on a regularly measured error between the sensed temperature and the target temperature.

The input type field may indicate a type of information handling resource associated with an entry 302. The input type may facilitate forward compatibility for the adaptive thermal control approaches set forth herein. For example, entry 302b includes the value "HDD" for its input type, indicating that the sensor is from a hard disk drive. If a thermal control algorithm of thermal control system 202 is designed to apply to thermal control of all input types including "HDD" for the input type, then thermal control system 202 may have forward compatibility with other sensors with input type HDD produced subsequent to the most-recent firmware update of system management controller 105.

Other than entries for remote sensors, other portions of thermal table 204 may include entries setting forth thermal parameters (e.g., target temperature, maximum temperature, etc.) regarding particular input types and/or input names (including virtual local input names of remote sensors).

Turning again to FIG. 2, host agent 206 may include any system, device, or apparatus configured to receive information regarding data collected from sensors remote to information handling system 102 (e.g., including remote device identifier, remote input name, and temperature sensed by the remote sensor) and forward such data as virtual thermal inputs to thermal control system 202 (e.g., by updated appropriate memory areas of a memory of system management controller 105 which are defined for virtual thermal inputs). Based on such virtual thermal inputs, local thermal inputs (e.g., from temperature sensor 107), and parameters set forth in thermal table 204 (e.g., maxima and/or targets for local and virtual thermal inputs), provide thermal control for components of chassis 101. In some embodiments, host agent 206 may be implemented as a program of executable instructions configured to be read and executed by system management controller 105 in order to carry out the functionality of thermal control system 202, including that functionality described herein.

As shown in FIG. 2, chassis management controller 112 may include a chassis agent 208 and an air mover control 210. Chassis agent 208 may comprise any system, device, or apparatus configured to receive data from sensors remote to information handling systems 102 (e.g., temperature sensor 140, temperature sensors 212a, 212b of peripheral 200, etc.) and communicate such data to host agent 206 of system management controller 105. In some embodiments, chassis agent 208 may be implemented as a program of executable instructions configured to be read and executed by system management controller 105 in order to carry out the functionality of thermal control system 202, including that functionality described herein.

Any suitable framework may be used to transfer sensor data between chassis agent 208 and host agent 206. For example, data may be transferred from chassis agent 208 to host agent 206 in a "send-receive" fashion or a "subscribe-notify" fashion via any suitable message transport approach. In some embodiments, a central data manager located on chassis management controller 112 may manage broadcasts and/or send selective notifications to individual nodes. The former may allow for chassis agent 208 to send all info to host agent 206, whereas the latter may allow for host agent 206 to selectively receive the information in which it is interested. This may allow system management controller 105 to selectively filter sensor data based on its subscription. In some embodiments, host agent 206 may also be able to communicate information to chassis agent 208, in order to cause chassis management controller 112 to take different actions or communicate information to other components.

A peripheral 200 as shown in FIG. 2 may include any information handling resource of chassis 101 external to information handling system 102 (e.g., disk drives 130). As shown in FIG. 2, a peripheral 200 may include one or more temperature sensors 212. In some embodiments, a peripheral may be a "passive" device without a controller similar to system management controller 105 or chassis management controller 112. A temperature sensor 212 may include any system, device, or apparatus (e.g., a thermometer, thermistor, etc.) configured to communicate a signal indicative of a temperature within peripheral 200. For example, in some embodiments, temperature sensor 212a may be configured to sense a temperature ambient to peripheral 200 while temperature sensor 212b may be configured to sense a temperature of a component (e.g., integrated circuit package) of peripheral 200.

The systems and methods described above may facilitate numerous thermal adaptation approaches, including without limitation automatic remote sensor thermal adaptation and automatic remote peripheral thermal adaptation. In automatic remote sensor thermal adaptation, thermal control system 202 may be configured to thermally manage the information handling system 102 on which it is executing and/or portions of chassis 101 based at least on data received from sensors remote to information handling systems 102. For example, in some instances, it might be known that certain remote temperature sensors provide more reliable information for thermal control than that of temperature sensors local to an information handling system 102. Accordingly, thermal control system 202 may be configured to determine if certain virtual thermal inputs are being received by system management controller 105 and if so, use temperature data of such virtual thermal inputs rather than temperature data from local thermal inputs. As a specific example, it may be "known" by thermal control system 202 that a chassis inlet sensor of a G5 chassis having local input name "VTI_1" provides a more reliable temperature reading than an ambient temperature sensor of an information handling system 102. Accordingly, if a memory location for "VTI_1" is populated with a value, then thermal control system 202 may select such virtual temperature input over local temperature sensor information. Uses of virtual thermal inputs and applications thereof are not limited to the example set forth in this paragraph.

Figure 4:
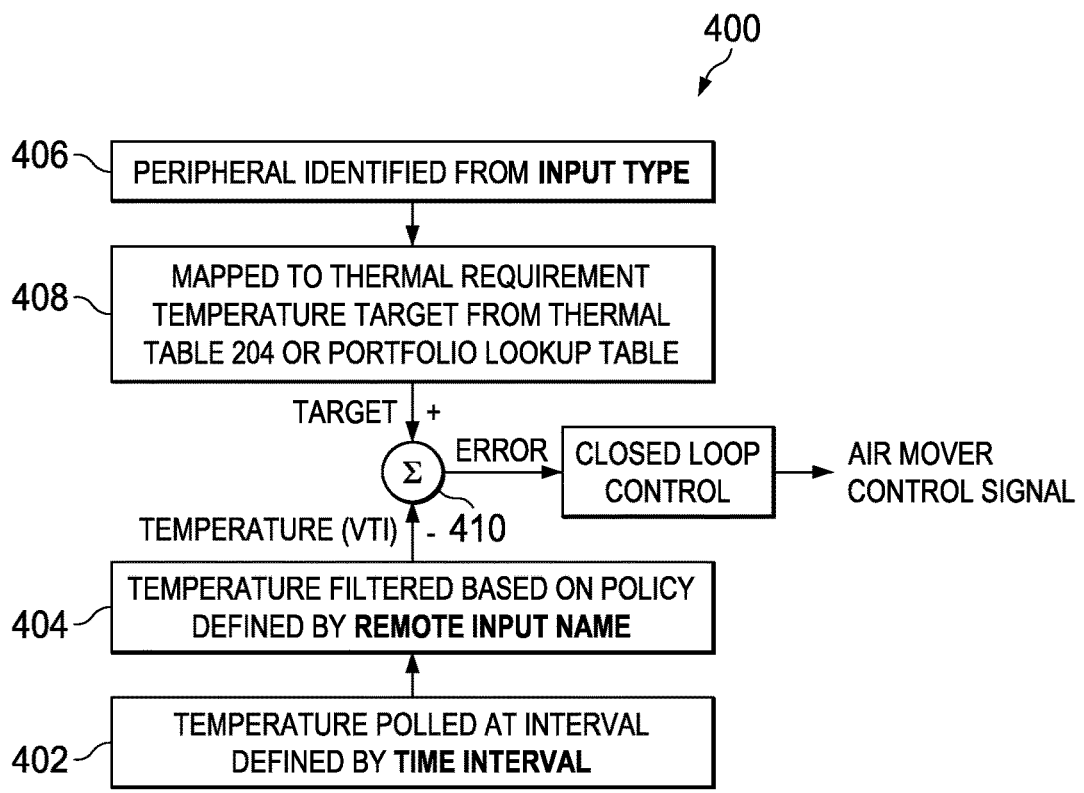
FIG. 4 illustrates a block diagram of an example control architecture for remote peripheral thermal adaptation, in accordance with embodiments of the present disclosure.

In automatic remote peripheral thermal adaptation, thermal control system 202 may be configured to thermally manage a peripheral 200 based on temperature sensor data communicated from the peripheral 200. FIG. 4 illustrates a block diagram of an example control architecture 400 for remote peripheral thermal adaptation, in accordance with embodiments of the present disclosure. Control architecture 400 may be implemented by thermal control system 202, or any other suitable system.

As shown in FIG. 4, at block 402, temperature of a remote sensor present on a peripheral (e.g., a temperature sensor 212) may be polled at an interval defined in thermal table 204 for a sensor having such remote device identifier and remote input name. At block 404, the sensed temperature may be filtered based on a policy defined by the remote input name of the sensor (e.g., set forth in thermal table 204). For example, some policies may filter our erroneous or outlier sensor readings (e.g., by averaging or low-pass filtering sensor readings over time). As another example, some policies may provide that reports to as user that one or more thresholds have been exceeded. As a further example, some polices may condition a sensed temperature signal to control a response to the signal. As a result of such filtering, block 404 generates a temperature value. At block 406, the type of peripheral associated with the temperature sensor may be identified based on the input type of the sensor as set forth in thermal table 204. Based on the input type, block 408 may determine a thermal requirement for the peripheral (e.g., a target temperature of the temperature sensor for such a device). Such thermal requirement may be obtained from thermal table 204 or a lookup table mapping input types to thermal requirements. Accordingly, by using such approach, the need to define a remote sensor target at system management controller 105 for multiple information handling systems 102 in a system chassis comprising multiple information handling systems may be eliminated. Block 408 may thus generate a target temperature for the remote sensor.

Summer 410 may calculate an error between the sensor temperature and the target temperature for the sensor. At block 412, a closed loop control algorithm may be applied to generate an air mover control signal in order to minimize the error. In some embodiments, the approach used herein may allow for closed loop control which requires no pre-tuning of parameters in thermal table 204.

In some embodiments, some or all elements of thermal control by thermal control system 202 may be closed loop or adaptive. In such adaptive or closed loop control, feedback data (e.g., thermal data) may be sensed and communicated to thermal control system 202 in order to minimize an error between two parameters (e.g., a desired temperature and an actual measured temperature). In these and other embodiments, some or all elements of thermal control by thermal control system 202 may be open loop. In such open loop control, thermal components operate at a certain set point or status based on a measured temperature (e.g., a sensed temperature may be provided to a look-up table that defines a particular air mover speed based on such sensed temperature).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
   a processor; and
   a system management controller communicatively coupled to the processor and comprising:
   a thermal table comprising identifying parameters for supported remote temperature sensors external to the information handling system;
   a host agent configured to receive temperature sensor data of a remote temperature sensor external to the information handling system, wherein the temperature sensor data of the remote temperature sensor has a higher reliability than temperature sensor data of a selected local temperature sensor of the information handling system that is identified by a local input identifier; and
   a thermal control system configured to provide thermal control of at least one of the information handling system and a chassis in which the information handling system is disposed by:
   in response to an entry of the thermal table that is associated with the remote temperature sensor being populated, automatically virtualizing the received temperature sensor data of the remote temperature sensor as a virtual thermal input that corresponds to the local input identifier of the information handling system, wherein the virtualizing includes automatically replacing the selected local temperature sensor with the remote temperature sensor in association with the local input identifier; and controlling thermal properties of at least one of the information handling system and the chassis based on the virtual thermal input and a temperature value associated therewith.

2. The information handling system of claim 1, wherein the identifying parameters comprise a remote device identifier identifying a remote information handling resource providing the sensor data, a remote input identifying the remote temperature sensor, and the local input identifier of the remote temperature sensor.

3. The information handling system of claim 2, wherein the identifying parameters further comprise at least one of:
a sampling interval defining the frequency at which the data of the remote temperature sensor is to be updated;
a thermal control type defining whether the sensor data corresponding to the remote temperature sensor should be applied to open loop thermal control or closed loop thermal control; and
an input type field defining a type of information handling resource with which the remote temperature sensor is associated.

4. The information handling system of claim 1, wherein controlling thermal properties of at least one of the information handling system and the chassis comprises controlling operation of information handling resources of the information handling system based on the temperature value.

5. The information handling system of claim 1, wherein controlling thermal properties of at least one of the information handling system and the chassis comprises controlling operation of an air mover of the chassis based on the temperature value.

6. The information handling system of claim 1, wherein the temperature sensor is integral to a peripheral device of the chassis external to the information handling system, and controlling thermal properties of at least one of the information handling system and the chassis comprises controlling an air mover of the chassis based on the temperature value in order to minimize a difference between the temperature value and a target temperature associated with the peripheral.

7. The information handling system of claim 1, wherein the host agent is configured to receive the temperature sensor data from a chassis management controller of the chassis.

8. A method comprising:
receiving temperature sensor data of a remote temperature sensor external to a modular information handling system disposed in a chassis, wherein the temperature sensor data of the remote temperature sensor has a higher reliability than temperature sensor data of a selected local temperature sensor of the modular information handling system that is identified by a local input identifier; and
thermally controlling at least one of the information handling system and the chassis by:
in response to an entry of a thermal table that is associated with the remote temperature sensor being populated, wherein the thermal table comprises identifying parameters for supported remote temperature sensors external to the information handling system, automatically virtualizing the received temperature sensor data of the remote temperature sensor as a virtual thermal input that corresponds to the local input identifier of the information handling system, wherein the virtualizing includes automatically replacing the selected local temperature sensor with the remote temperature sensor in association with the local input identifier; and
controlling thermal properties of at least one of the information handling system and the chassis based on the virtual thermal input and a temperature value associated therewith.

9. The method of claim 8, wherein the identifying parameters comprise a remote device identifier identifying a remote information handling resource providing the sensor data, a remote input identifying the remote temperature sensor, and the local input identifier of the remote temperature sensor.

10. The method of claim 9, wherein the identifying parameters further comprise at least one of:
a sampling interval defining the frequency at which the data of the remote temperature sensor is to be updated;
a thermal control type defining whether the sensor data corresponding to the remote temperature sensor should be applied to open loop thermal control or closed loop thermal control; and
an input type field defining a type of information handling resource with which the remote temperature sensor is associated.

11. The method of claim 8, wherein controlling thermal properties of at least one of the information handling system and the chassis comprises controlling operation of information handling resources of the information handling system based on the temperature value.

12. The method of claim 8, further comprising, based on reliability information, prioritizing the virtual thermal input over at least one local temperature sensor.

13. The method of claim 8, wherein the temperature sensor is integral to a peripheral device of the chassis external to the information handling system, and controlling thermal properties of at least one of the information handling system and the chassis comprises controlling an air mover of the chassis based on the temperature value in order to minimize a difference between the temperature value and a target temperature associated with the peripheral.

14. The method of claim 8, further comprising receiving the temperature sensor data from a chassis management controller of the chassis.

15. A system management controller comprising:
a thermal table comprising identifying parameters for supported remote temperature sensors external to an information handling system comprising the system management controller;
a host agent configured to receive temperature sensor data of a remote temperature sensor external to the information handling system, wherein the temperature sensor data of the remote temperature sensor has a higher reliability than temperature sensor data of a selected local temperature sensor of the information handling system that is identified by a local input identifier; and
a thermal control system configured to provide thermal control of at least one of the information handling system and a chassis in which the information handling system is disposed by:
in response to an entry of the thermal table associated with the remote temperature sensor being populated, automatically virtualizing the received temperature sensor data of the remote temperature sensor as a virtual thermal input that corresponds to the local input identifier of the information handling system, wherein the virtualizing includes automatically replacing the selected local temperature sensor with the remote temperature sensor in association with the local input identifier; and
controlling thermal properties of at least one of the information handling system and the chassis based on the virtual thermal input and a temperature value associated therewith.

16. The system management controller of claim 15, wherein the identifying parameters comprise a remote device identifier identifying a remote information handling resource providing the sensor data, a remote input identifying the remote temperature sensor, and the local input identifier of the remote temperature sensor.

17. The system management controller of claim 16, wherein the identifying parameters further comprise at least one of:
a sampling interval defining the frequency at which the data of the remote temperature sensor is to be updated;
a thermal control type defining whether the sensor data corresponding to the remote temperature sensor should be applied to open loop thermal control or closed loop thermal control; and
an input type field defining a type of information handling resource with which the remote temperature sensor is associated.

18. The system management controller of claim 15, wherein controlling thermal properties of at least one of the information handling system and the chassis comprises one of:
controlling operation of information handling resources of the information handling system based on the temperature value; and
controlling operation of an air mover of the chassis based on the temperature value.

19. The system management controller of claim 15, wherein the thermal table includes at least one entry that comprises a formula involving a plurality of temperature sensors.

20. The system management controller of claim 15, wherein the host agent is configured to subscribe to at least one source of temperature sensor data from a chassis management controller of the chassis, and further configured to receive notifications regarding the temperature sensor data based on the subscription.

* * * * *

UNITED STATES PATENT AND TRADEMARK OFFICE
CERTIFICATE OF CORRECTION

PATENT NO. : 10,082,848 B2
APPLICATION NO. : 14/679566
DATED : September 25, 2018
INVENTOR(S) : Iyer et al.

Page 1 of 1

It is certified that error appears in the above-identified patent and that said Letters Patent is hereby corrected as shown below:

In the Claims

Please amend Claim 6 as follows:
6. The information handling system of Claim 1, wherein the temperature sensor is integral to a peripheral device of the chassis external to the information handling system, and controlling thermal properties of at least one of the information handling system and the chassis comprises controlling an air mover of the chassis based on the temperature value in order to minimize a difference between the temperature value and a target temperature associated with the peripheral device.

Please amend Claim 13 as follows:
13. The method of Claim 8, wherein the temperature sensor is integral to a peripheral device of the chassis external to the information handling system, and controlling thermal properties of at least one of the information handling system and the chassis comprises controlling an air mover of the chassis based on the temperature value in order to minimize a difference between the temperature value and a target temperature associated with the peripheral device.

Signed and Sealed this
Fourth Day of December, 2018

Andrei Iancu
*Director of the United States Patent and Trademark Office*